United States Patent [19]

Barnes et al.

[11] 4,454,552
[45] Jun. 12, 1984

[54] PRINTED CIRCUIT BOARD CONNECTION SYSTEM

[75] Inventors: Richard A. Barnes, Crownsville, Md.; Gregory J. Bartz, Palm Bay, Fla.

[73] Assignee: General Electric Company, Syracuse, N.Y.

[21] Appl. No.: 378,882

[22] Filed: May 17, 1982

[51] Int. Cl.³ .................. H01R 13/64; H01H 9/20
[52] U.S. Cl. .................................. 361/9; 361/58; 361/339; 361/404; 361/412; 361/413
[58] Field of Search .............. 361/9, 58, 111, 404, 361/412, 413, 337, 339; 333/238; 339/17 M, 17 LM

[56] References Cited

U.S. PATENT DOCUMENTS

| | | | |
|---|---|---|---|
| 3,932,716 | 1/1976 | Mottel et al. | 361/339 X |
| 3,963,301 | 6/1976 | Stark | 361/413 X |
| 3,992,686 | 11/1976 | Canning | 333/238 |
| 3,993,935 | 11/1976 | Phillips et al. | 361/397 |
| 4,071,722 | 1/1978 | Hart | 361/339 X |
| 4,079,440 | 3/1978 | Ohnuma et al. | 361/424 |
| 4,245,270 | 1/1981 | Busby | 361/58 |
| 4,250,563 | 2/1981 | Struger | 364/900 |

Primary Examiner—E. A. Goldberg
Assistant Examiner—Derek Jennings
Attorney, Agent, or Firm—Carl W. Baker; Richard V. Lang

[57] ABSTRACT

A printed circuit board connection system provides multiple voltage level interconnection to each individual printed circuit board of a multiple board system via a common circuit board connector mounted on a backplane. Power supply and logic signals at each required voltage level are supplied to electrically isolated regions of the backplane, and are then connected via edge connectors to process control circuits on the respective printed circuit boards. A circuit board extraction handle includes an automatic disabling switch actuator to facilitate circuit board maintenance while power is on.

6 Claims, 3 Drawing Figures

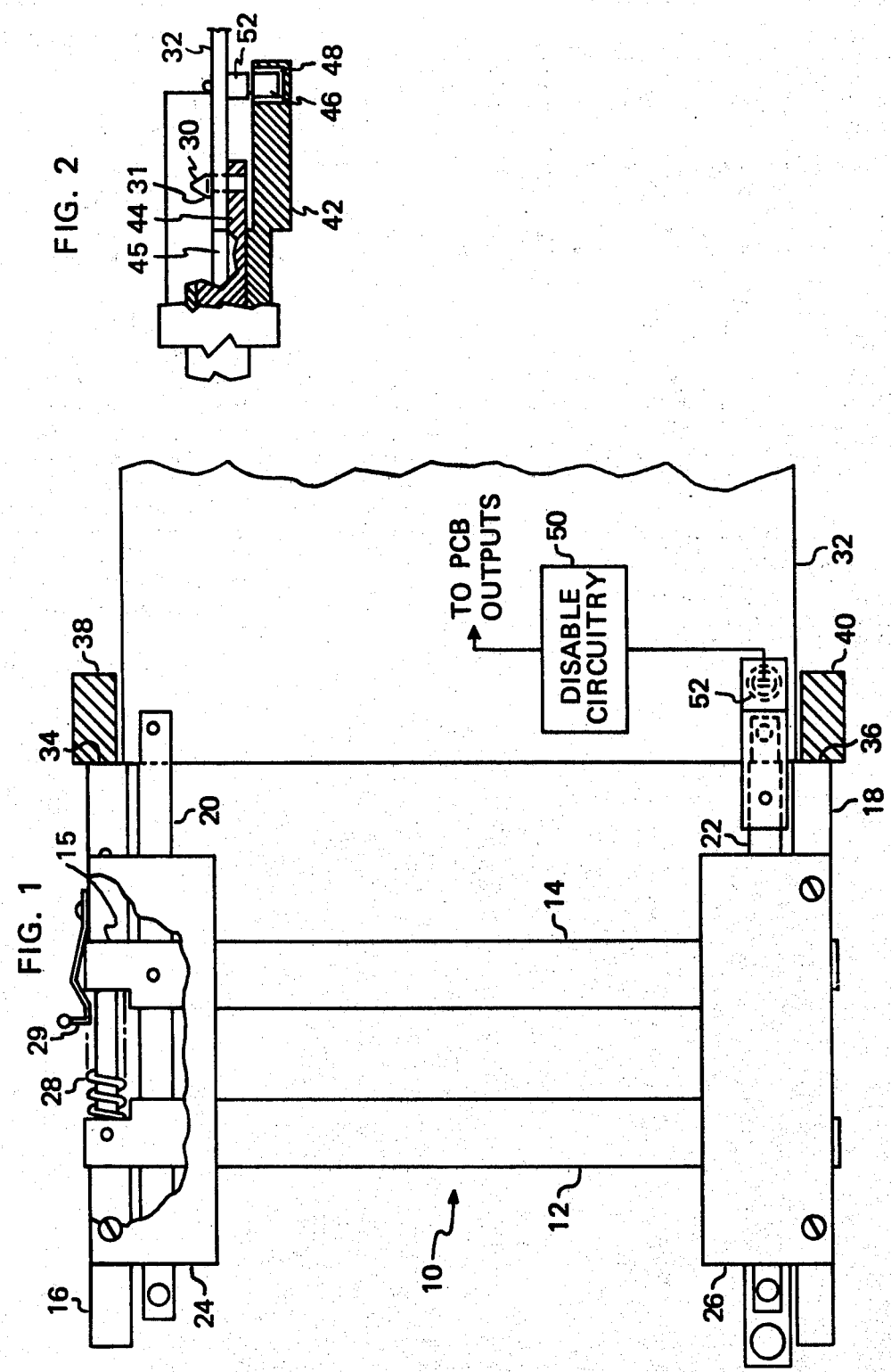

PRINTED CIRCUIT BOARD CONNECTION SYSTEM

BACKGROUND OF THE INVENTION

The present invention relates to a printed circuit board connection structure, and, more particularly, to a backplane connection configuration for the connection of a plurality of voltage levels to each of a plurality of printed circuit boards, and to a mechanism for the extraction and insertion of individual printed circuit boards into a backplane.

Previous designs for logic system backplanes, in which signals at more than one voltage level had to be processed, have employed a connector on the front card edge for high voltage levels or middle voltage levels and a separate connector attached to the backplane for low voltage, usually logic, signals. For example, the controller disclosed in U.S. Pat. No. 4,250,563, issued Feb. 10, 1981 to Struger, has input/output terminals wired to swing arm connectors on the front of the controller. This front card edge wiring must be installed manually, point-to-point, upon each board. This manual wiring step requires considerable time and a skilled operator to perform the necessary connections.

The power-on removal of printed circuit boards from conventional backplane connectors has involved the operation by maintenance personnel of disabling switches or similar equipment to ensure that the backplane contacts will not arc upon removal of the printed circuit board. For example, some prior art systems include toggle switches mounted upon each printed circuit board, which require that the maintenance personnel operate the switch prior to removal or insertion of the printed circuit board into the backplane. Failure to ensure that the switch is properly positioned prior to insertion or removal of the board results in the board being inserted or removed with some circuits in a current carrying condition. This can result in arcing and, in extreme cases, destruction of the printed circuit board contacts and the backplane connector contacts, especially for the high voltage contacts. With a large number of boards to be removed and/or inserted, there is an increase in the possibility that one or more of the switches would not be operated due to operator inattention or oversight. In U.S. Pat. No. 4,245,270 issued Jan. 13, 1981 to Busby, a phased power-down for circuit board removal is disclosed. However, the system disclosed by Busby allows removal of circuit boards without first shutting down each circuit, and each circuit may be decoupled while in a current carrying condition. Further the logic circuits may experience rapid output level changes resulting in sequencing of memory elements. Damage or destruction of the contacts on the printed circuit board or the backplane connector can require that the entire system be shut down while repairs are made. In a control system in which printed circuit boards are used to control many system operations, it is desirable, and essential in systems including critical control functions, to be able to replace a single circuit board or several circuit boards in a system without shutdown of the entire system and without requiring the maintenance person to manually operate a disabling circuit.

SUMMARY OF THE INVENTION

Accordingly, it is an object of the present invention to provide a backplane configuration providing multiple voltage level inputs to each printed circuit board, and to provide an automatic disabling mechanism for insertion and removal of printed circuit boards from the backplane.

Another object of the present invention is to provide a backplane configuration providing multiple voltage levels for each printed circuit board connector.

Another object of the present invention is to provide an extraction/insertion tool which includes an automatic output disable to ensure that the printed circuit board outputs are inactivated during insertion or extraction of the printed circuit board from the backplane.

Accordingly, the present invention includes a backplane configuration in which a plurality of independent voltage levels are connected to circuit board edge connectors on a single backplane. The voltage levels are electrically isolated from each other, but are arranged to provide electrical connection to each printed circuit board mounted upon the backplane. An extraction/insertion handle provides a mechanism for inserting or removing individual printed circuit boards from a backplane connector, and includes an automatic disable mechanism for disabling the output circuits on the printed circuit board at any time during insertion or extraction of the printed circuit board. In a particularly preferred embodiment, the output disable mechanism includes a magnetically actuated switch on each printed circuit board and a magnetic switch actuator disposed on the extraction/insertion handle.

BRIEF DESCRIPTION OF THE DRAWINGS

Features of the invention believed to be novel and unobvious over the prior art are set forth with particularity in the appended claims. The invention itself, however, as to organization, method of operation and best mode contemplated, together with further objects and advantages thereof, may best be understood by reference to the following description taken in conjunction with the accompanying drawings, in which like reference characters refer to like elements throughout, and in which:

FIG. 1 is a schematic top view of an extraction handle incorporating the disabling mechanism of the present invention;

FIG. 2 is a partial cross-sectional view of the circuit board engaging mechanism of the extraction handle shown in FIG. 1 with parts broken out for clarity.

DESCRIPTION OF THE PREFERRED EMBODIMENTS

Figure 3:
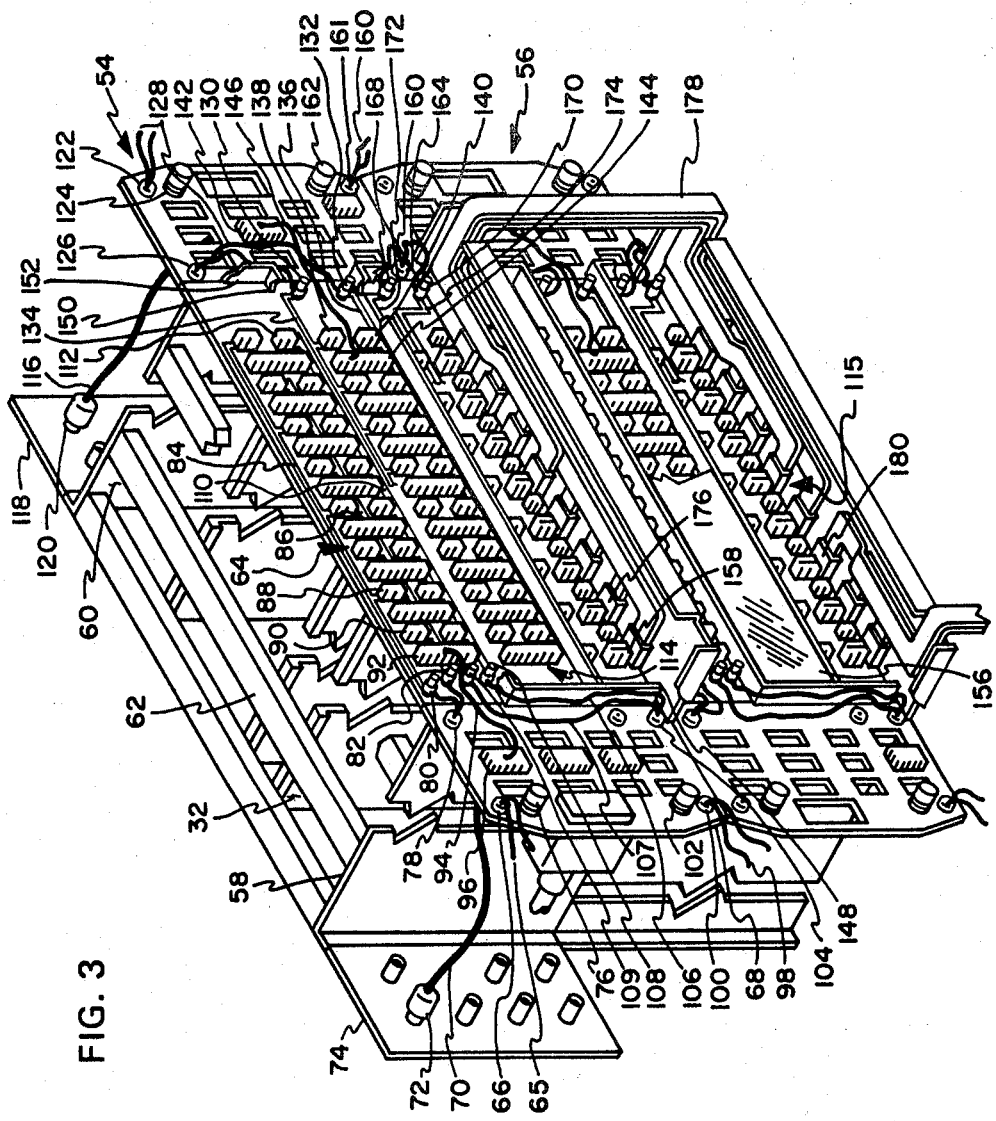
FIG. 3 is a schematic pictorial view of a backplane configuration according to the present invention.

An extraction/insertion handle with a disable mechanism is shown schematically in FIGS. 1 and 2. The handle 10 comprises a pair of bars 12, 14 attached respectively to arms 16, 18 and 20, 22. Nylon sleeves 24 and 26 are attached to the members 16, 18 respectively to guide the relative motion of the arms to retain the parallel position of the adjacent arms 16, 20 and 18, 22. Bars 12, 14 are kept separated by a pair of springs 28 which surround arms 16, 18 respectively. Arms 20, 22 have locating pins 30 which project perpendicularly therefrom, and are positioned near the ends of arms 20, 22 to fit into complementary holes within a circuit board 32 whenever the ends 34, 36 of arms 16, 18 respectively, engage abutments, 38, 40 mounted upon the rack for supporting the printed circuit boards. The end of pin 30 is preferably offset to provide a lip 31 projecting from one side thereof to securely grasp board 32. Mounted upon arm 22 is a bar 42 which extends beyond the support member 44 and includes a magnet 46 mounted in a hole 48 for actuating a magnetic switch located upon each circuit board of the system for activating disable circuitry. The support bar 42 is made of a nonmagnetic material or the hole 48 is shielded with nonmagnetic material, so that no effects of the magnet on one board are felt by the switches on adjacent boards. If desired an indicator light (not shown) may be attached to the circuit board to indicate when the disable circuitry is activated. With the pins 30 engaging board 32 the bars 12, 14 are grasped by the operator and drawn toward each other so that circuit board 32 is drawn into a slot 45 in arm 16 and a similar slot (not shown) in arm 18 until spring loaded detent 29 engages edge 15 of bar 14. In this position the board and handle may be moved as desired without risk that the board will become disengaged from the extraction handle. This allows convenient handling of the circuit boards and reduces the risk of damaging the equipment, since the board is securely held without any contact to the circuit elements mounted upon the board. When the board 32 is being inserted into a backplane the detent 29 is manually released to allow separation of the board from the handle.

Each circuit board 32 to be employed in the system includes disable circuitry 50 connected to a magnetically actuable switch 52 positioned so that, when the handle 10 is in contact with the printed circuit board, switch 52 is closed by the magnet 46 activating the disable circuitry 50. The disable circuitry 50 is connected to the printed circuit board output circuits, so that whenever the disable circuit is closed, all outputs are brought to a low voltage level. Upon attachment of the handle 10 to the printed circuit board 32 all inductive currents through the printed circuit board backplane connector are interrupted. This ensures that the connector pins will not arc, which could result in pitting or destroying connector pins. All system printed circuit board outputs are driven to a high impedance state, without generating extraneous voltage transitions. Thus, follow-on pulse driven circuitry and/or equipment will not be sequenced improperly. Since all logic inputs are resistively pulled low, they will go to this state with a source driver at a high impedance. Therefore, regardless of the condition of individual circuits at the time of engagement of the handle 10 to circuit board 32, all circuits are disabled prior to removal of the printed circuit board from the backplane.

As will be appreciated by those skilled in the art, other types of switches than the magnetically actuated switch shown could be employed. For example, a mechanical preloaded toggle switch could be positioned upon the circuit board, so that upon attachment of the handle to a printed circuit board the switch activates disabling circuitry, and upon removal of the handle the switch returns to its original position inactivating the disabling circuitry, thereby accomplishing the same results as the magnetically actuated switch described above.

The backplane arrangement is illustrated schematically in FIG. 3. Two backplane sections 54, 56 of a control panel are illustrated, but it is to be understood that the number of such sections to be employed in a particular system would be dictated by the size of the system being assembled. Attached to each of the backplane boards 54, 56 is a frame consisting of sidewalls 58, 60 and cross members 62. The size of sidewalls 58, 60 would be dictated by the dimensions of the circuit boards. The individual printed circuit boards 32, which may be of the type described in the copending U.S. Patent application Ser. No. 339,745, filed Jan. 15, 1982 by R. A. Barnes, one of the present inventors, and assigned to the present assignee, include edge contacts for connection of external power supply and logic circuits to the process control circuits on the respective boards. The process control circuits are activated when connected to said external circuits to process the input signals from the external circuits and produce output signals for controlling the functioning of external equipment attached to the control panel. The edge contacts of the respective boards mate with electrical contact elements of standard edge connectors (not shown) attached to the backplane sections 54,56.

The present invention has the capability to provide power supply and logic connections from a plurality of outside sources at distinct voltage levels to each of the printed circuit boards. Each backplane has a high voltage section 64 including a set of I/O (input/output) pins for connecting high voltage circuitry upon the printed circuit boards 32 to external high voltage equipment, such as field equipment being monitored or controlled by the control panel. High voltage AC power is supplied via power cables 65 which pass through grommet 66 in board 54. The supply is fused as shown at 76 to which power cables 65 are connected. The power cables are then connected through grommet 78 to lugs 80, 82 on board 54. Printed connections 84, 86 are provided to arrays of power connector pins 88, 90 connected to respective edge connectors. High voltage DC power is provided via input cables 98 which pass through grommet 100 and is fused as shown at 102. The DC power is then connected via grommet 104 by hardwire conductors 106, 107 soldered to lugs 108, 109. Lugs 108, 109 are connected by printed circuit conductors 110 to arrays of power connector pins 112 which are connected to respective ones of the contacts in the connectors for printed circuit boards 32. High voltage logic signals are connected by cables, such as shown at 70 which extends from a connector 72 in front panel 74 to connect on back surface 68 with the group of input pins 96. The logic signals are connected from input pins 96 by conductors 94 to logic connector pins 92. For high voltage logic functions requiring circuitry on multiple circuit boards, interconnections between backplane boards for high voltage logic signals are provided to the front panel 74 by connector cables (not shown), so that the present system is not limited to the signal processing functions disposed upon a single board, resulting in considerable system design flexibility. High voltage logic control circuits are used in high electromagnetic noise environments, such as industrial facilities and power stations, to prevent control signal errors from being caused by noise from external sources. The number and arrangement of pins in a group 96 can be varied as required to provide the necessary high voltage interconnections, and the arrangement shown is for illustration purposes only. The backplane includes a middle voltage section 114 to which a middle voltage level DC power supply is connected via cables 128, which pass through grommet 122 on board 54. The mid-level voltage is fused at 124 and connected through grommet 126 via power cables 128 connected to lugs 130, 132 on the middle level voltage section of the backplane. Printed circuit connections 134, 136 supply power to arrays of power connector pins 138, 140, respectively. Logic signals to and from external switches or other electrical gear driving external equipment are brought in at connector 120 on front panel 118 and are conducted via cables such as 116 to the pins of the group 142 of input pins. Input pins 142 are connected to individual pins of a logic connector pin array 144 via conductors such as shown at 146. These mid-voltage logic signals are more immune to interference than standard low voltage logic signals, and are used where the high voltage levels are not required. For mid-level voltage logic functions requiring circuitry on multiple circuit boards, interconnections between boards are provided to the front panel 118 by connecting cables (not shown).

As shown in FIG. 3, the mid-level voltage section 114 of the backplane is separated from the high voltage section 64 by insulating barriers 148, 150, 152 and from the low voltage section 115 by insulating barrier 154. A cover 156 of insulating material, such as polycarbonate resin sheet material sold under the trademark Lexan® by the General Electric Company, is placed over the barriers to completely enclose the mid-level voltage connections on the backplane. Similar covers are employed for the high voltage and low voltage connection sections of the backplane, thereby providing complete electrical isolation to ensure that no unintentional contact occurs between circuits at different voltage levels. This ensures that extraneous noise signals or fault conditions do not propagate between voltage levels and adversely affect functional operation of other non-related functions.

The low voltage section 115 has a plurality of arrays of logic connection pins 158 for low voltage logic connections between the printed circuit boards connected to the backplane. Low voltage power conductors 160 are brought to grommet 161 at the backplane 54, are fused at 162, and pass through grommet 164 to be connected to lugs 168, 170. Printed circuit connections 172, 174 are provided to the individual pins of the arrays of pins 158 which pass through backplane board 54 and make electrical contact to circuit boards 32 through the edge connectors located on the side 68 of board 54 opposite pins 158. As shown at 176 connections to adjacent backplane boards is supplied for low voltage logic signals by cables 178 to contacts 180 on the backplane 56. In the present invention low voltage logic signals are restricted to the signal processing circuits on the printed circuit boards, so that no low voltage connections to external equipment are required. If the system were required to provide such logic signals to external equipment, appropriate external connection circuits could be provided. It will be appreciated by those skilled in the art that although three voltage levels are shown fewer or more could be supplied to a printed circuit board backplane if required.

The backplane may employ exclusively hardwire interconnections between the I/O pins on the backplane for each voltage level and external connections. Alternatively, an etched configuration, or a combination of etch and hardwire connections, as shown in FIG. 3, may be employed. In a specific example employing 3 voltage levels, high voltage connections for 120 volts AC and 125 volts DC were provided by 24 gauge (AWG) hardwire conductors, medium voltage connections for 24 volt AC and 24 volt DC were provided by 26 gauge (AWG) hardwire connectors. The wiring was performed using a wiring machine sold by Cooper Industries, Inc. under the trademark of Wirewrap®. Other wiring techniques, such as stitchwiring may be used. The power handling capability of individual etch connections can be selected for an etch configuration, so that the entire backplane could be fabricated using etch technology. Thus, the present invention provides the system flexibility available from using precisely the conductor size necessary for each voltage level employed for a backplane configuration. If other voltage levels than those described were required, the wire size could be selected to accommodate the voltage and current levels anticipated for each section of the backplane for whatever system application is anticipated.

By employing the system described in the present invention the necessity for wiring point-to-point on the front edge of each circuit board is eliminated and as many voltage and current levels as are necessary to provide the functions required by a particular system can be connected through the backplane to the printed circuit boards. This greatly facilitates manufacture and handling of the system. The wiring may be done with automated equipment by semi-skilled personnel, rather than the highly skilled personnel required to do the point-to-point front edge wiring of the prior art. Further, the extraction handle with the output disable mechanism allows the maintenance of the system by semi-skilled personnel, since no specific action is required of the maintenance personnel to ensure that a specific system condition, i.e., output disabled, exists prior to the removal of a control logic board from a control panel. Therefore, the present invention provides for a low cost, easily maintained and easily manufactured construction for a printed circuit board connection system.

We claim:

1. A printed circuit board connection assembly comprising:

a planar backplane;

a plurality of edge connector means disposed generally parallel to each other upon one major surface of said backplane for providing electrical connection to a plurality of printed circuit boards;

power connection means disposed upon said backplane for connecting a plurality of sources of electrical power at distinct voltage levels to individual circuits of each of said plurality of printed circuit boards; said power connection means comprising a plurality of sets of electrically conductive power connection pins extending through said backplane and projecting from the major surface of said backplane opposite said first major surface; each said set of power connection pins being arranged in a plurality of arrays for supplying electrical power at said distinct voltage levels to a respective one of said edge connector means;

logic connection means disposed upon said backplane for connecting logic circuits at a plurality of distinct voltage levels to individual circuits of each of said plurality of printed circuit boards; said logic connection means comprising a plurality of sets of electrically conductive logic connection pins extending through said backplane and projecting from said one major surface of said backplane; each said set of logic connection pins being arranged in a plurality of arrays for supplying logic signals at said distinct voltage levels to a respective one of said edge connector means;

each set of said power connection pins being disposed upon said opposite major surface of said backplane in close proximity to a set of said logic connection pins;

electrical isolation means for dividing said opposite major surface into a plurality of distinct, electrically isolated sections surrounding said proximate sets of power connection pins and logic connection pins;

a plurality of electrical terminals disposed adjacent one of said sets of power connection pins;

a plurality of power conductors for supplying power from an external power source at a predetermined voltage to said terminals;

electrical conductor means for connecting said terminals to the respective ones of the pins of said set of power connection pins;

a plurality of means for supplying logic signals to respective ones of each said array of logic connection pins, each said means including a plurality of arrays of input pins disposed adjacent one of said sets of logic connection pins; and electrical conductor means for connecting respective ones of said array of input pins to respective pins of one of said arrays of logic connection pins.

2. The invention of claim 1 further comprising:

a source of 125 volt AC power and a source of 125 volt DC power for supplying electrical power to respective ones of a first set of power connection pins;

a source of 24 volt DC power for supplying electrical power to respective ones of a second set of power connection pins; and a source of 12 volt DC power for supplying electrical power to respective ones of a third set of power connection pins.

3. The invention of claim 2 wherein said logic connection means comprises:

first logic connection means for connecting 125 volt logic signals to a first set of logic connection pins;

second logic connection means for connecting 24 volt logic signals to a second set of logic connection pins; and third logic connection means for connecting 12 volt logic signals to a third set of logic connection pins.

4. A printed circuit board handling and output disable system comprising:

manually operable circuit board insertion/extraction means including handle means for detachably engaging a printed circuit board during insertion and removal of the board;

output disable means disposed on the printed circuit board including switch means and an output disable circuit for disabling the board output upon actuation of said switch means; and switch actuator means carried by said handle means in position to actuate said switch means to its "off" position when said handle means is in engagement with said circuit board and to "on" position when detached therefrom.

5. The invention of claim 4 wherein said manually operable circuit board extraction handle comprises circuit board locating pins disposed thereon and abutment means for locating said pins in holes through said printed circuit board when said extraction means is in engagement with said circuit board.

6. The invention of claim 4, wherein said disable circuit actuation means comprises a magnet disposed on said extraction means for actuating a magnetic switch disposed on said printed circuit board and connected to said output disable circuit.

* * * * *